(12) United States Patent
Costello et al.

(10) Patent No.: US 9,735,481 B2
(45) Date of Patent: Aug. 15, 2017

(54) DAUGHTER CARD ASSEMBLY AND COMMUNICATION SYSTEM INCLUDING THE SAME

(71) Applicant: Tyco Electronics Corporation, Berwyn, PA (US)

(72) Inventors: Brian Patrick Costello, Scotts Valley, CA (US); Christopher David Ritter, Hummelstown, PA (US); Steven Lee Flickinger, Hummelstown, PA (US); Evan Charles Wickes, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 430 days.

(21) Appl. No.: 14/098,285

(22) Filed: Dec. 5, 2013

(65) Prior Publication Data

US 2015/0162680 A1 Jun. 11, 2015

(51) Int. Cl.
*H05K 5/00* (2006.01)
*H01R 9/24* (2006.01)
(Continued)

(52) U.S. Cl.
CPC ....... *H01R 9/2408* (2013.01); *H01R 13/6471* (2013.01); *H01R 13/74* (2013.01);
(Continued)

(58) Field of Classification Search
CPC ...... H05K 1/141; H05K 1/142; H05K 7/1451; H05K 3/429; H05K 2201/044; H05K 2201/1034; H01L 2924/01079; G02B 6/3897; G02B 6/4257; H01R 13/6587; H01R 12/737; H01R 12/721;
(Continued)

(56) References Cited

U.S. PATENT DOCUMENTS 6,824,429 B2 * 11/2004 Hwang .............. H01R 23/6873
439/607.2
6,932,514 B2 * 8/2005 Anderson ............ G02B 6/3825
385/56
(Continued)

FOREIGN PATENT DOCUMENTS

NL 0918376 A2 * 5/1999 ........... H01R 23/688
NL 0971451 A2 * 1/2000 ........... H01R 13/514

*Primary Examiner* — Binh Tran (57) ABSTRACT

Daughter card assembly including a circuit board and leading and trailing connectors mounted to the circuit board. The leading and trailing connectors have mating ends that face in different directions along a board plane. The daughter card assembly also includes a support wall that is coupled to the circuit board and extends orthogonal to the circuit board. The support wall has a wall opening therethrough. The trailing connector is positioned on the circuit board such that the mating end substantially aligns with the wall opening. The daughter card assembly also includes a retention shroud that projects from an exterior surface of the support wall. The retention shroud defines a shroud passage that aligns with the wall opening. The shroud and wall openings form a receiving passage for receiving at least one of the trailing connector or a corresponding cable connector that mates with the trailing connector.

17 Claims, 7 Drawing Sheets

(51) Int. Cl.

| | | |
|---|---|---|
| *H01R 13/6471* | (2011.01) | |
| *H01R 13/74* | (2006.01) | |
| *H05K 1/11* | (2006.01) | |
| *H05K 1/14* | (2006.01) | |
| *H01R 13/64* | (2006.01) | |
| *H01R 13/60* | (2006.01) | |
| *G02B 6/00* | (2006.01) | |
| *G02B 6/38* | (2006.01) | |
| *H01R 12/50* | (2011.01) | |
| *G02B 6/42* | (2006.01) | |
| *H01R 12/72* | (2011.01) | |

(52) U.S. Cl.
CPC .......... *G02B 6/3897* (2013.01); *G02B 6/4257* (2013.01); *H01R 12/724* (2013.01); *H01R 23/70* (2013.01); *H05K 2201/044* (2013.01); *H05K 2201/1034* (2013.01)

(58) Field of Classification Search
CPC .............. H01R 13/6471; H01R 12/724; H01R 12/7082; H01R 12/716; H01R 12/73; H01R 13/6585; H01R 12/585; H01R 13/514; H01R 13/6594; H01R 23/688; H01R 43/16; H01R 12/7005; H01R 12/712; H01R 23/70

USPC ....... 361/748, 752, 756, 760, 784, 785, 788, 361/790, 796, 802, 759, 791; 174/262; 439/377, 541.5; 385/92, 135
See application file for complete search history.

(56) References Cited

U.S. PATENT DOCUMENTS

| | | | |
|---|---|---|---|
| 7,042,737 B1 * | 5/2006 | Woolsey | H05K 7/1445 |
| | | | 174/384 |
| 7,074,087 B2 | 7/2006 | Szezesny et al. | |
| 7,224,947 B2 * | 5/2007 | Sit | H04B 1/03 |
| | | | 439/64 |
| 7,762,846 B1 | 7/2010 | Whiteman, Jr. et al. | |
| 8,098,493 B2 | 1/2012 | Ice | |
| 2004/0037054 A1 * | 2/2004 | Ice | H05K 7/1418 |
| | | | 361/752 |
| 2013/0288539 A1 * | 10/2013 | McClellan et al. | 439/686 |
| 2014/0120749 A1 * | 5/2014 | Drew | H01R 12/71 |
| | | | 439/78 |
| 2015/0111421 A1 * | 4/2015 | Rossman | 439/527 |

\* cited by examiner

DAUGHTER CARD ASSEMBLY AND COMMUNICATION SYSTEM INCLUDING THE SAME

BACKGROUND OF THE INVENTION

The subject matter herein relates generally to communication systems that utilize daughter card assemblies.

Backplane or midplane communication systems, such as network systems, servers, data centers, and the like, use large circuit boards, known as backplanes or midplanes, to interconnect daughter card assemblies. In a conventional system, the backplane or midplane has an array of electrical connectors mounted thereto. The daughter card assemblies, which may be line card assemblies or switch card assemblies, include a daughter card (or circuit board) having one or more high-speed data connectors positioned along a leading edge of the daughter card. The data connectors may have high-density arrays of signal and ground contacts that are configured for differential signal transmission and may obtain high data rates, such as 56 gigabits per second (Gb/s) or more. The data connectors are configured to mate with corresponding electrical connectors of the backplane or midplane circuit board when the daughter card assembly is loaded into the communication system.

The daughter card assemblies may also include one or more input/output (I/O) connector assemblies positioned along a trailing edge of the daughter card that are communicatively coupled through the daughter card to the data connectors along the leading edge. For example, the I/O connector assemblies may be small form-factor pluggable (SFP) transceivers or quad small form-factor pluggable (QSFP) transceivers. The I/O connector assemblies typically have an electrical connector and a receptacle cage that surrounds the electrical connector. The electrical connector may be located a depth within a cavity that is defined by the receptacle cage.

Each of the I/O connector assemblies may receive a single pluggable module that is inserted into the cavity to engage the electrical connector therein. The pluggable module is coupled to a corresponding cable that interconnects the pluggable module to, for example, another pluggable module or another connector. The receptacle cage shields the electrical connector within the cavity from electromagnetic interference. The receptacle cage may also protect the electrical connector from damage if the cable to which the pluggable module is attached is inadvertently pulled or twisted.

Although the I/O connector assemblies described above have been effective, such I/O connector assemblies may not be capable of achieving an electrical performance that is equal to the data connectors along the leading edge of the daughter card. However, the data connectors along the leading edge are not mechanically configured to be positioned along the trailing edge and receive a single pluggable module as described above. For example, if the cable were inadvertently pulled or twisted, the pluggable module may damage the data connector.

Accordingly, a need remains for a daughter card assembly having a data connector along a trailing edge that is capable of mating with a pluggable connector and maintaining the engagement.

BRIEF DESCRIPTION OF THE INVENTION

In one embodiment, a daughter card assembly is provided that includes a circuit board having body edges that coincide with a board plane. The body edges include a leading edge and a trailing edge. The daughter card assembly also includes leading and trailing connectors mounted to the circuit board and communicatively coupled to each other through the circuit board. The leading and trailing connectors are proximate to the leading and trailing edges, respectively, and have mating ends that face in different directions along the board plane. The daughter card assembly also includes a support wall that is coupled to the circuit board and extends orthogonal to the circuit board along the trailing edge. The support wall has opposite interior and exterior surfaces and a wall opening therethrough. The trailing connector is positioned on the circuit board such that the mating end of the trailing connector substantially aligns with the wall opening. The daughter card assembly also includes a retention shroud projecting from the exterior surface of the support wall. The retention shroud defines a shroud passage that aligns with the wall opening of the support wall. The shroud passage receiving at least one of the trailing connector or a corresponding cable connector that mates with the trailing connector.

In another embodiment, a daughter card assembly is provided that includes a circuit board having body edges that coincide with a board plane. The body edges include a leading edge and a trailing edge. The daughter card assembly also includes a data connector mounted to the circuit board. The data connector has a mating end that is configured to mate with an electrical connector. The data connector includes a mating array of signal and ground contacts along the mating end configured for differential transmission. The mating end faces in a direction along the board plane. The daughter card assembly also includes a support wall that is coupled to the circuit board and extends orthogonal to the circuit board and along one of the body edges. The support wall has opposite interior and exterior surfaces and a wall opening therethrough. The data connector is positioned on the circuit board such that the mating end of the data connector aligns with the wall opening. The daughter card assembly also includes a retention shroud projecting from the exterior surface of the support wall. The retention shroud defines a shroud passage that aligns with the wall opening of the support wall. The shroud passage receiving at least one of the data connector or the electrical connector that mates with the data connector. The retention shroud is separate from the data connector and indirectly coupled to the data connector through the support wall.

In another embodiment, a backplane or midplane communication system that includes at least one circuit board having an array of electrical connectors mounted thereto. The communication system also includes first and second daughter card assemblies that are engaged to corresponding electrical connectors along the circuit board(s). Each of the first and second daughter card assemblies includes a daughter card having a leading edge and a trailing edge. The leading edge interfaces with the circuit board(s). Each of the first and second daughter card assemblies includes a trailing connector mounted to the daughter card proximate to the trailing edge and having a mating end. The trailing connector includes a mating array of signal and ground contacts at the mating end configured for differential transmission. The communication system also includes a cable assembly having first and second cable connectors and a communication cable that interconnects the first and second cable connectors. The first and second cable connectors are configured to mate with the trailing connectors of the first and second daughter card assemblies, respectively.

DETAILED DESCRIPTION OF THE INVENTION

Embodiments set forth herein include communication systems and daughter card assemblies that may be used with such communication systems. The daughter card assemblies may include data connectors that are configured to engage cable connectors. In some embodiments, the daughter card assemblies include multiple data connectors that are communicatively coupled to one another through a daughter card. For example, one or more of the data connectors may be positioned along a leading edge of the daughter card and one or more of the data connectors may be positioned along a trailing edge of the daughter card.

As set forth herein, the communication systems and the daughter card assemblies may have a number of electrical connectors. To distinguish the various electrical connectors, the electrical connectors may be referred herein to as data connectors, cable connectors, leading connectors, trailing connectors, header connectors, receptacle connectors, etc. However, electrical connectors having different names or labels do not necessarily require structural differences. Moreover, different labels may be given to the same type of electrical connector depending upon the circumstances. For example, leading and trailing connectors may also be referred to as data connectors and may, in some embodiments, have identical configurations.

The communication systems and daughter card assemblies set forth herein may be used in various applications. By way of example only, the communication systems may be used in telecom and computer applications, routers, servers, supercomputers, and uninterruptible power supply (UPS) systems. In such embodiments, the communication systems may be described as backplane or midplane systems. One or more of the electrical connectors described herein may be similar to electrical connectors of the STRADA Whisper or Z-PACK TinMan product lines developed by TE Connectivity. For example, one or more of the electrical connectors may be capable of transmitting data signals at high speeds, such as 10 gigabits per second (Gb/s), 20 Gb/s, 30 Gb/s, or more. In more particular embodiments, one or more of the electrical connectors may be capable of transmitting data signals at 40 Gb/s, 50 Gb/s, or more. In some embodiments, the electrical connectors may include high-density, two-dimensional arrays of signal contacts. A high-density array may have, for example, at least 12 signal contacts per 100 mm$^2$. In more particular embodiments, the high-density array may have at least 20 signal contacts per 100 mm$^2$.

Figure 1:
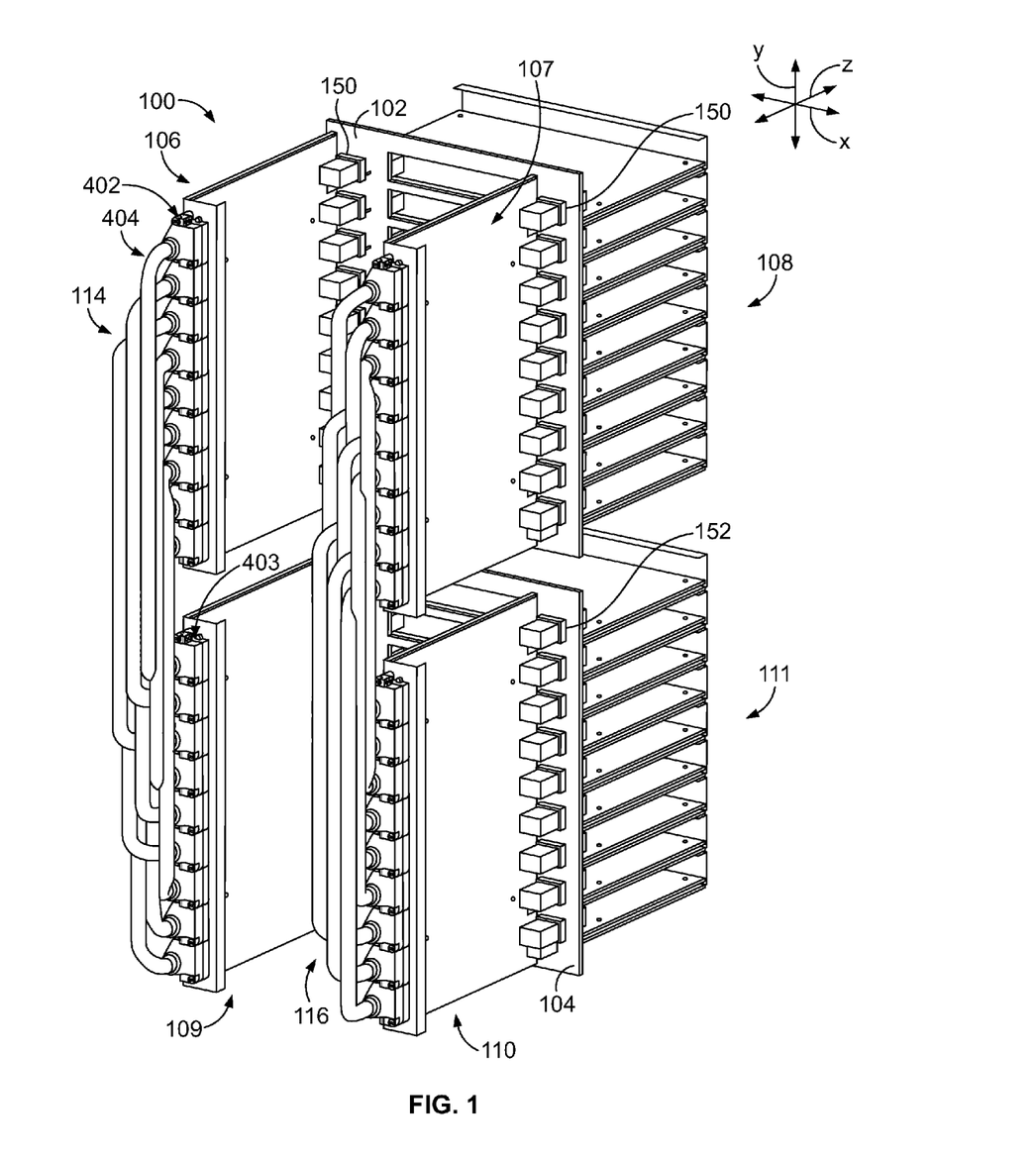
FIG. 1 is a perspective view of a communication system formed in accordance with an embodiment.

FIG. 1 is a perspective view of a communication system 100 formed in accordance with an embodiment. For reference, the communication system 100 and its components are oriented with respect to mutually perpendicular X-, Y-, and Z-axes. The communication system 100 includes daughter card assemblies 106, 107, 108, 109, 110, and 111 and circuit boards 102 and 104 that are configured to engage the daughter card assemblies 106-111. Specifically, the daughter card assemblies 106, 107 are engaged to the circuit board 102 and are communicatively coupled to the daughter card assemblies 108 through the circuit board 102. The daughter card assemblies 109, 110 are engaged to the circuit board 104 and are communicatively coupled to the daughter card assemblies 111 through the circuit board 104. In the illustrated embodiment, the daughter card assemblies 106, 107, 109, 110 are switch card assemblies and the daughter card assemblies 108, 111 are line card assemblies.

The daughter card assemblies 106, 109 may be interconnected to each other through cable assemblies 114, and the daughter card assemblies 107, 110 may be interconnected to each other through cable assemblies 116. As shown in FIG. 1 and described in greater detail below, the cable assembly 114 may have cable connectors 402, 403 and a communication cable 404 that interconnects the cable connectors 402, 403. The cable assemblies 116 may have similar configurations.

The circuit boards 102, 104 include electrical connectors 150, 152, respectively, which are hereafter referred to as header connectors. The header connectors 150, 152 are mounted to side surfaces of the circuit boards 102, 104, respectively. The header connectors 150 are configured to engage the daughter card assemblies 106, 107, and the header connectors 152 are configured to engage the daughter card assemblies 109, 110. The circuit boards 102, 104 may be positioned within a cabinet (not shown) such that the circuit boards 102, 104 coincide with or extend parallel to a plane defined by the X- and Y-axes. The daughter card assemblies 106-111 are configured to be advanced into the cabinet along the Z-axis to engage the corresponding circuit boards 102, 104. Although not shown, the communication system 100 may include additional components, such as a chassis, power supplies, cooling fan, etc.

Figure 2:
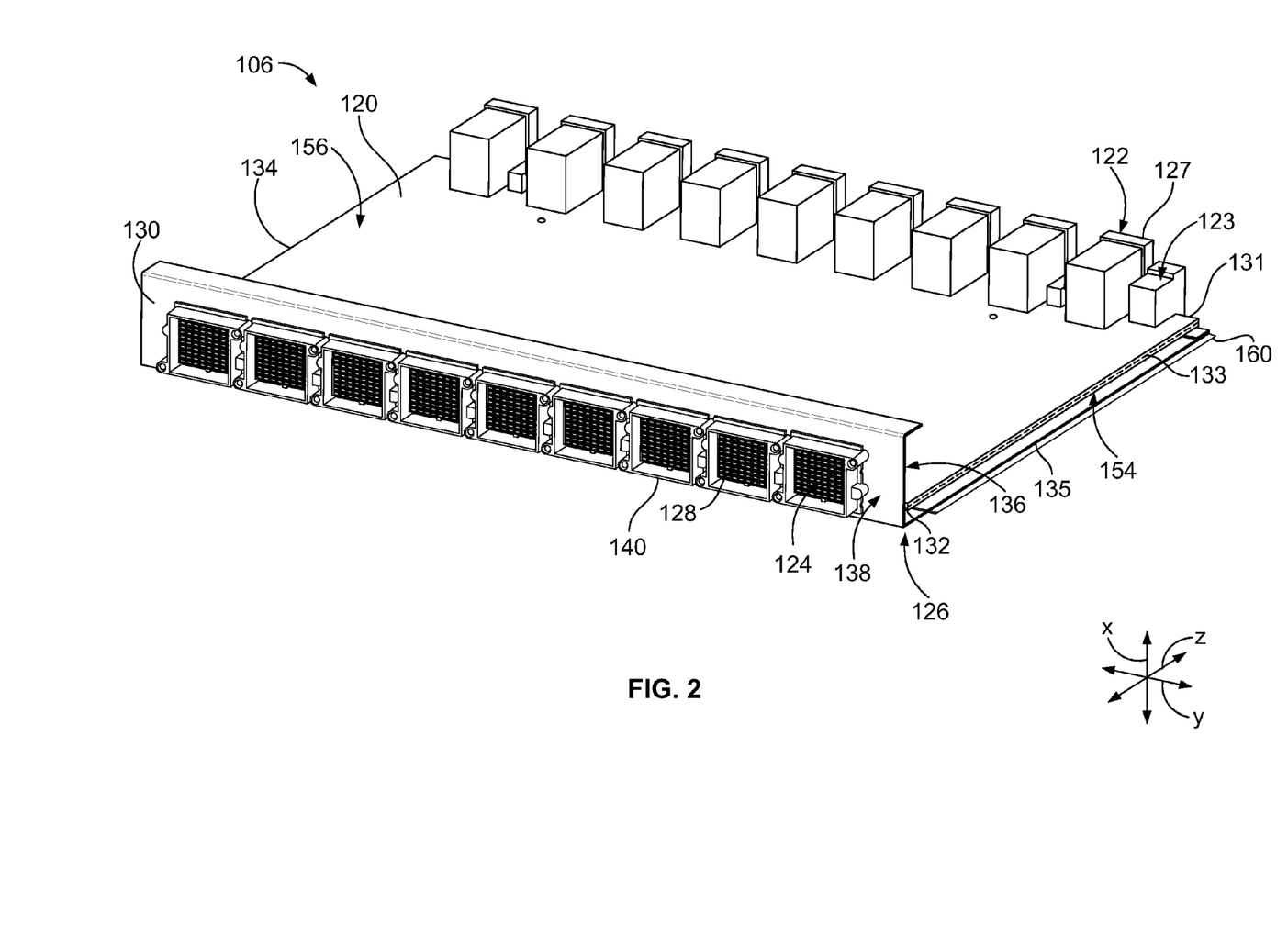
FIG. 2 is a perspective view of a daughter card assembly formed in accordance with an embodiment that may be used in the communication system of FIG. 1.

FIG. 2 is a perspective view of an exemplary daughter card assembly 106. Although the following is with respect to the daughter card assembly 106, the description may be similarly applied to the daughter card assemblies 107, 109, 110 shown in FIG. 1. The daughter card assembly 106 includes a circuit board 120, which may also be referred to as a daughter card. In the illustrated embodiment, the daughter card assembly 106 also includes electrical connectors 122, 123, and 124 mounted to the circuit board 120 and a loading frame 126 that is coupled to the circuit board 120.

The circuit board 120 has opposite board sides 154, 156 and a profile that is defined by a plurality of body edges 131, 132, 133, and 134, including a leading edge 131, a trailing edge 132, and side edges 133, 134 that extend between and join the leading and trailing edges 131, 132. The leading edge 131 is configured to interface with or extend proximate to the circuit board 102 (FIG. 1). The circuit board 120 coincides with a board plane 160 that extends parallel to the Y- and Z-axes. The circuit board 120 may be a printed circuit board (PCB) and include a plurality of stacked substrate layers having conductive elements, such as traces, plated thru-holes, pads, and the like, therein. The substrate layers may comprise, for example, FR-4 material.

The electrical connectors 122, 123 are mounted proximate to the leading edge 131 and, as such, are hereinafter referred to as leading connectors. The trailing connectors 124 are mounted proximate to the trailing edge 132 and are hereinafter referred to as trailing connectors. For example, mating ends 127, 128 of the leading and trailing connectors 122, 124, respectively, may extend beyond the corresponding edge 131, 132, may be flush with the corresponding edge, or may be recessed a small distance from the corresponding edge of the circuit board 120. The daughter card assembly 106 may include a plurality of each of the electrical connectors 122-124. By way of example only, the daughter card assembly 106 includes nine (9) leading connectors 122 and nine (9) trailing connectors 124. The leading connectors 122 and the trailing connectors 124 may be communicatively coupled to one another through the conductive elements of the circuit board 120. One or more of the trailing connectors 124 may be exclusively coupled to corresponding leading connectors 122 and/or one or more of the trailing connectors 124 may be communicatively coupled to a plurality of the leading connectors 122. In other embodiments, the leading connectors 122 may be communicatively coupled to one another through the circuit board 120 and/or the trailing connectors 124 may be communicatively coupled to one another through the circuit board 120.

As described in greater detail below, the trailing connectors 124 may be coupled to the cable assemblies 114 (FIG. 1) that interconnect the trailing connectors 124 to trailing connectors of the daughter card assembly 109 (FIG. 1). The leading connectors 123 may be power connectors configured to transmit electrical power between the circuit board 120 and the circuit board 102 (FIG. 1). In the illustrated embodiment, the leading and trailing connectors 122, 124 are data connectors configured to transmit data signals. Depending on configuration, the leading and trailing connectors 122, 124 may also be referred to as header or receptacle connectors.

The loading frame 126 is configured to provide structural integrity to the daughter card assembly 106 and/or facilitate loading and unloading the daughter card assembly 106 into a cabinet or chassis (not shown). The loading frame 126 may be secured to the circuit board 120 using fasteners (not shown), such as screws or rivets. The loading frame 126 may be formed from a sheet of rigid material. For example, the loading frame 126 may be stamped and formed from sheet metal to include the features described herein.

The loading frame 126 includes a support wall 130 that is proximate to and extends parallel to the trailing edge 132. The support wall 130 may have a substantially planar structure or body. In some embodiments, the loading frame 126 may have additional walls. For example, the loading frame 126 in FIG. 2 includes a board wall 135. The board wall 135 has a substantially planar structure that extends parallel to the board plane 160 along the board side 154. The loading frame 126 may be a single continuous structure such that the support and board walls 130, 135 are part of the same continuous piece of material. Optionally, the loading frame 126 may form a box-like structure. For instance, the loading frame 126 may include another board wall (not shown) that is opposite the board wall 135 with the circuit board 120 therebetween and another support wall (not shown) that extends along the leading edge 131.

The support wall 130 may be coupled (directly or indirectly) to the circuit board 120 and extends orthogonal to the circuit board 120 (or the board plane 160) along the trailing edge 132. The support wall 130 extends parallel to the X and Y axes. In the illustrated embodiment, the support wall 130 is coupled to the board wall 135 that, in turn, is coupled to the circuit board 120. The support wall 130 has opposite interior and exterior surfaces 136, 138. The interior surface 136 faces an interior of the daughter card assembly 106 in a first direction along the Z-axis. For example, the interior surface 136 faces the circuit board 120 and the electrical connectors 122-124. The interior surface 136 also faces the circuit board 102 (FIG. 1). The exterior surface 138 faces an exterior of the daughter card assembly 106 in an opposite second direction along the Z-axis.

The leading connectors 122 include respective mating ends 127, and the trailing connectors 124 include respective mating ends 128. Each of the mating ends 127, 128 may have a contact array of signal and ground contacts (not shown), such as the signal and ground contacts 236, 254 in FIG. 3. In the illustrated embodiment, the mating ends 127, 128 face in opposite directions that are parallel to the board plane 160 (or along the Z-axis). The leading and trailing connectors 122, 124 may be proximate to the leading and trailing edges 131, 132, respectively. The leading connectors 122 are configured to engage corresponding header connectors 150 (FIG. 1) coupled to the circuit board 102 when the daughter card assembly 106 is loaded into the communication system 100 (FIG. 1). The trailing connectors 124 are positioned proximate to the trailing edge 132 such that the mating ends 128 may extend through wall openings 370 (shown in FIG. 6) and be exposed for mating with the cable assemblies 114 (FIG. 1).

The daughter card assembly 106 may also include a retention shroud 140 that projects from the exterior surface 138 of the support wall 130. The retention shroud 140 is configured to align the cable connector 402 (FIG. 1) with the mating end 128 of the trailing connector 124 and/or mechanically secure the cable connector 402 to the daughter card assembly 106. The retention shroud 140 is configured to receive the cable connector 402 when the cable connector 402 is advanced in a mating direction along the Z-axis. The retention shroud 140 may also cooperate with the support wall 130 to protect the trailing connector 124 from damage caused by external stresses or forces, such as when the cable connector 402 is inadvertently pulled in a non-mating direction that is away from the daughter card assembly 106 or in a non-mating direction along the X- and/or Y-axes.

In the illustrated embodiment, the daughter card assembly 106 only includes a single support wall 130 with multiple retention shrouds 140 proximate to the trailing edge 132. The support wall 130 spans the entire trailing edge 132. In other embodiments, the support wall 130 may extend along only a portion of the trailing edge 132, or the daughter card assembly 106 may have multiple support walls that extend along different portions of the trailing edge 132.

Yet in other embodiments, the daughter card assembly may have the support wall and retention shroud(s) along a different edge. For example, the support wall 130 and the retention shroud(s) 140 may be positioned along the leading edge 131 in FIG. 2 instead of the trailing edge 132. Moreover, in other embodiments, the daughter card assembly may have support walls and corresponding retention shrouds along multiple edges. For instance, each of the leading and trailing edges 131, 132 of the daughter card assembly 106 may have a respective support wall therealong with one or more retention shrouds mounted thereto. The support walls and retention shrouds may be similar or identical to the support walls and retention shrouds described herein. In such embodiments that include support walls along multiple edges, the daughter card assembly may function as, for example, a transition device between two communication systems.

Figure 3:
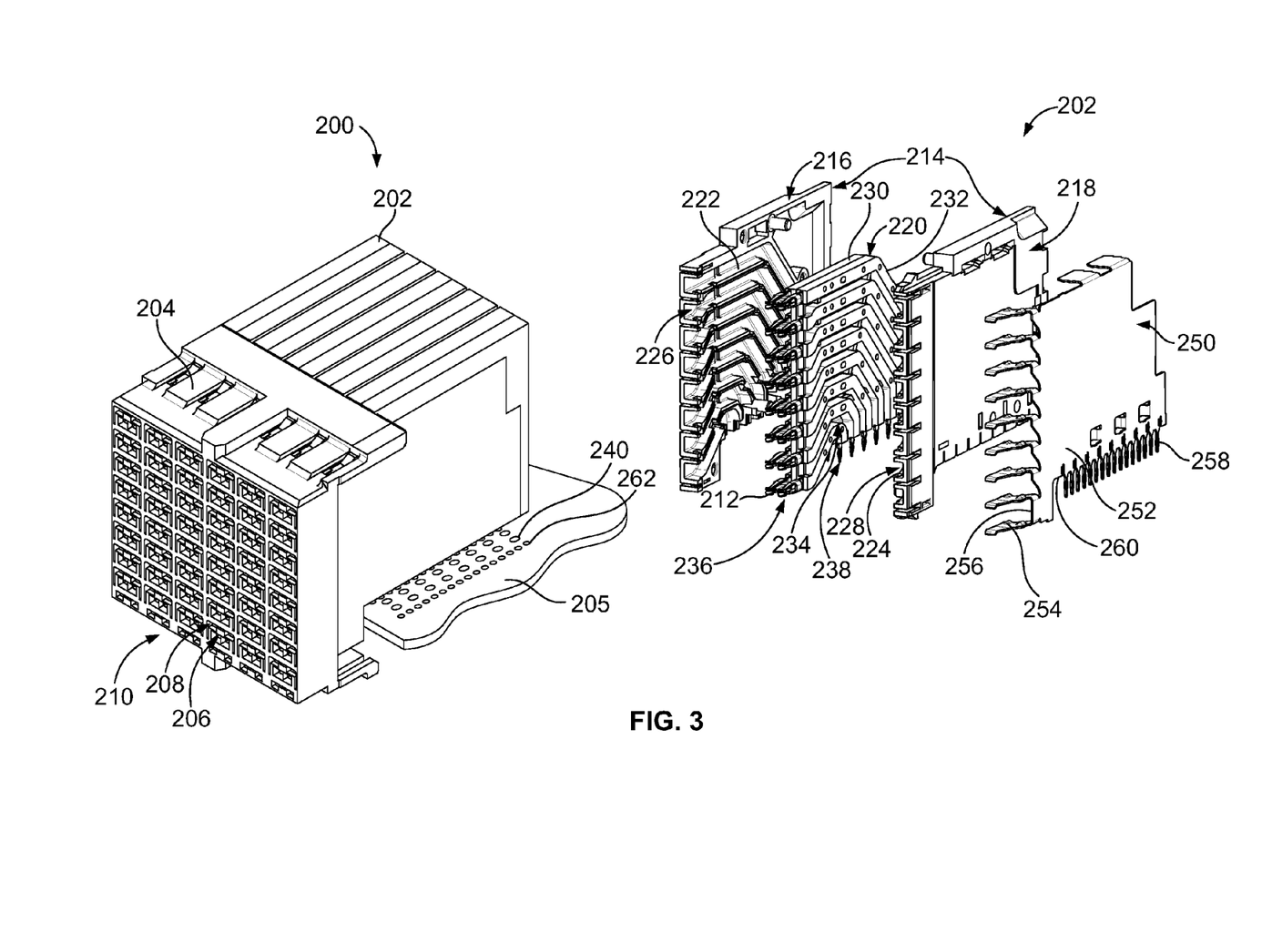
FIG. 3 is a partially exploded perspective view of an electrical connector formed in accordance with one embodiment that may be used in the communication system of FIG. 1.

FIG. 3 is a partially exploded perspective view of an electrical connector 200 formed in accordance with one embodiment. The electrical connector 200 may be used as the trailing connector 124 (FIG. 2) and/or as the leading connector 122 (FIG. 2). As shown, the electrical connector 200 includes a plurality of contact modules 202 and a front housing 204 that is coupled to the contact modules 202. FIG. 3 illustrates one of the contact modules 202 in an exploded state prior to assembly. The contact modules 202 are configured to be stacked side-by-side and loaded into the front housing 204. The front housing 204 includes a plurality of signal contact openings 206 and a plurality of ground contact openings 208 at a mating end 210 of the front housing 204. The mating end 210 is configured to mate with another connector, such as the cable connector 402 shown in FIG. 8. The signal contact openings 206 are configured to receive cable contacts therein, such as the cable contacts 410 (shown in FIG. 8), and the ground contact openings 208 are configured to receive ground shields therein, such as the ground contacts 412 (shown in FIG. 8).

The front housing 204 is manufactured from a dielectric material, such as a plastic material, and provides isolation between the signal contact openings 206 and the ground contact openings 208. The ground contact openings 208 are C-shaped in the illustrated embodiment, but other shapes are possible in alternative embodiments. The signal contact openings 206 are chamfered at the mating end 210 to guide the cable contacts into the signal contact openings 206 during mating. The cable contacts may be pin-shaped.

The contact module 202 includes a conductive holder 214, which in the illustrated embodiment includes a first holder member 216 and a second holder member 218 that are coupled together to form the conductive holder 214. The holder members 216, 218 are fabricated from a conductive material. For example, the holder members 216, 218 may be die cast from a metal material. Alternatively, the holder members 216, 218 may be stamped and formed or may be fabricated from a plastic material that has been metalized or coated with a metallic layer. By having the holder members 216, 218 fabricated from a conductive material, the holder members 216, 218 may provide electrical shielding for the electrical connector 200.

The conductive holder 214 is configured to hold a frame assembly 220 of the contact module 202. The holder members 216, 218 include tabs 222, 224 that extend inward toward one another to define discrete channels 226, 228, respectively. The tabs 222, 224 are configured to extend into the frame assembly 220 such that the tabs 222, 224 are positioned between signal conductors 212 to provide shielding between corresponding signal conductors 212.

The frame assembly 220 includes a pair of dielectric frames 230, 232 surrounding the signal conductors 212. The dielectric frames 230, 232 include openings 234 that receive the tabs 222, 224. The openings 234 are located between adjacent signal conductors 212 such that when the tabs 222, 224 are loaded into the openings 234, the tabs 222, 224 are positioned between adjacent signal conductors 212 to provide shielding between such signal conductors 212.

The signal conductors 212 have signal contacts 236 extending from the front walls of the dielectric frames 230, 232 and mounting contacts 238 extending from the bottom walls of the dielectric frames 230, 232. Other configurations are possible in alternative embodiments. The signal contacts 236 and the mounting contacts 238 are exposed portions of the signal conductors 212 that extend from the dielectric frames 230, 232. In an exemplary embodiment, the signal contacts 236 extend generally perpendicular with respect to the mounting contacts 238. Encased portions of the signal conductors 212 transition between the signal contacts 236 and the mounting contacts 238 within the dielectric frames 230, 232. The signal contacts 236 are configured to be mated with and electrically connected to the cable contacts. The mounting contacts 238 are configured to be electrically connected to a circuit board 205, which may be similar to the circuit board 120 (FIG. 2). For example, the mounting contacts 238 may include compliant pins that extend into conductive vias 240 in the circuit board 205.

In an exemplary embodiment, the signal conductors 212 are arranged as differential pairs. One of the signal conductors 212 of each pair is held by the dielectric frame 230 while the other signal conductor 212 of the differential pair is held by the other dielectric frame 232. The signal conductors 212 of each pair extend through the frame assembly 220 generally along parallel paths such that the signal conductors 212 are skewless between the signal contacts 236 and the mounting contacts 238.

The holder members 216, 218 may provide shielding from electromagnetic interference (EMI) and/or radio frequency interference (RFI) and may prevent crosstalk between different pairs of signal conductors 212. The holder members 216, 218 may be configured to control electrical characteristics, such as impedance control, crosstalk control, and the like, of the signal conductors 212.

The contact module 202 may also include a ground shield 250 coupled to one side of the conductive holder 214. The ground shield 250 includes a main body 252 that is generally planar and extends alongside of the second holder member 218. The ground shield 250 includes ground contacts 254 extending from a front 256 of the main body 252. The ground contacts 254 are configured to extend into the ground contact openings 208. The ground contacts 254 are configured to be positioned between pairs of the signal conductors 212. The ground contacts 254 provide shielding along the signal contacts 236 of the signal conductors 212.

The ground shield 250 includes ground pins 258 extending from a bottom 260 of the ground shield 250. The ground pins 258 may be compliant pins. The ground pins 258 are configured to be received in corresponding conductive vias 262 in the circuit board 205. During assembly, the frame assembly 220 is loaded into the conductive holder 214. The first and second holder members 216, 218 are coupled together around the frame assembly 220. The ground shield 250 is coupled to the second holder member 218. The contact module 202 is then loaded into the rear of the front housing 204. Once all of the contact modules 202 are loaded into the front housing 204, the electrical connector 200 may be mounted to the circuit board 205 by loading the mounting contacts 238 and the ground pins 258 into the conductive vias 240, 262, respectively. When the multiple contact modules 202 are stacked side-by-side, the signal contacts 236 and the ground contacts 254 may collectively form a contact array. For example, the contact array may be a high density array as described herein.

Figure 4:
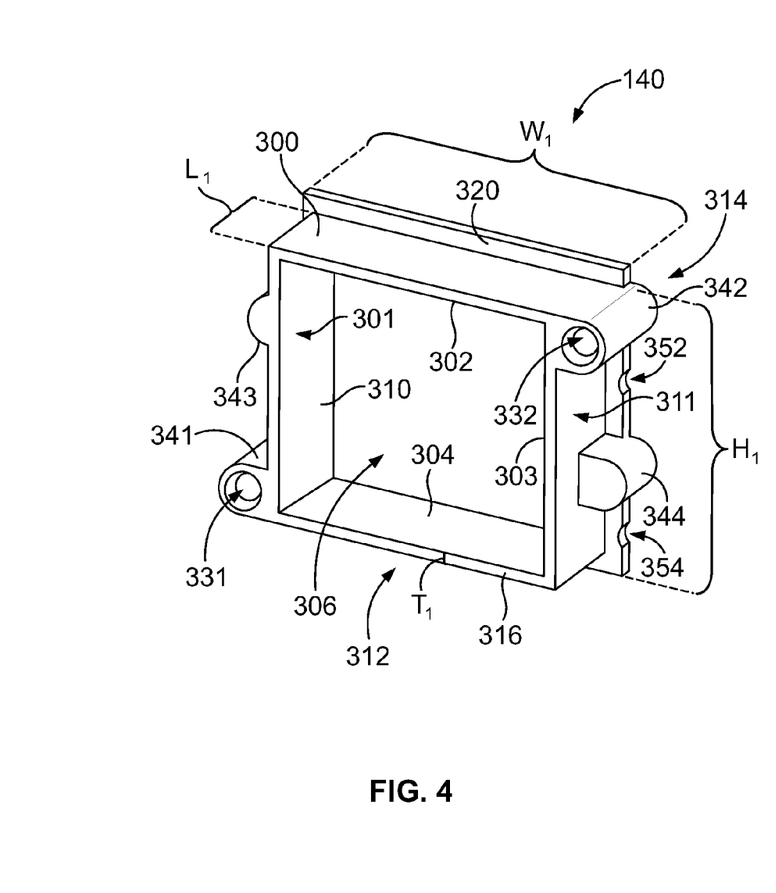
FIG. 4 is a front perspective view of a retention shroud that may be used in the communication system of FIG. 1.
Figure 5:
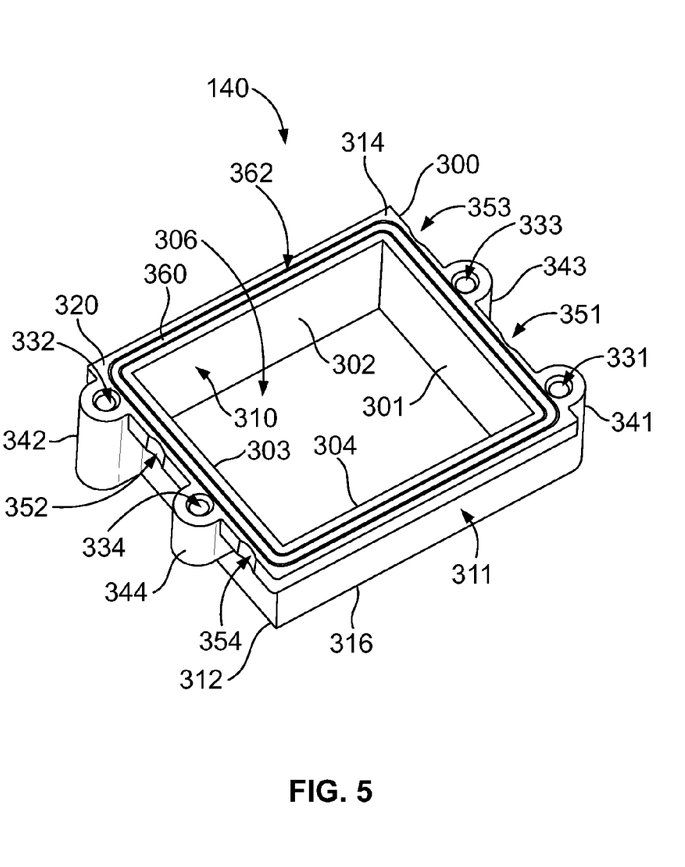
FIG. 5 is a rear perspective view of the retention shroud that may be used in the communication system of FIG. 1.

FIG. 4 is a front perspective view of the retention shroud 140, and FIG. 5 is a rear perspective view of the retention shroud 140. The retention shroud 140 is configured to be secured to the support wall 130 (FIG. 2) in a fixed position. In certain embodiments, the retention shroud 140 is configured to align the cable connector 402 (FIG. 1) with the trailing connector 124 (FIG. 2) and/or maintain the mechanical and electrical engagement between the cable and trailing connectors 402, 124. In some embodiments, the retention shroud 140 may electrically couple the cable connector 402 (FIG. 1) to the support wall 130 to establish a ground pathway. As shown in FIG. 4, the retention shroud 140 includes a shroud body 300 having a height $H_1$, a width $W_1$, and a length or depth $L_1$. The shroud body 300 may be substantially square such that the height $H_1$ and the width $W_1$ are substantially equal.

As shown in FIGS. 4 and 5, the shroud body 300 includes front and back sides 312, 314. The front side 312 is configured to engage the cable connector 402 and the back side 314 is configured to engage the support wall 130 (FIG. 2). The shroud body 300 has a plurality of shroud walls 301, 302, 303, and 304 that extend around and define a shroud passage 306 that extends through the shroud body 300 between the front and back sides 312, 314. The shroud passage 306 extends the length $L_1$ (FIG. 4) of the shroud body 300.

The shroud body 300 may be formed from metal or formed from a plastic material that includes metal particles or metalized surfaces. As such, the shroud body 300 may be conductive. The shroud body 300 is a single continuous piece of material in the illustrated embodiment that is die-cast or molded. Accordingly, the shroud walls 301-304 may be wall portions of one continuous shroud wall that circumscribes the shroud passage 306. In alternative embodiments, one or more of the shroud walls 301-304 may be secured to the other shroud walls to form the shroud body 300. As shown, the shroud body 300 includes an inner shroud surface 310 that extends along the shroud walls 301-304 and faces inward and an outer shroud surface 311 that extends along the shroud walls 301-304 and faces outward.

The shroud body 300 has a mating edge 316 along the front side 312 that defines an access to the shroud passage 306. The mating edge 316 may extend along the shroud walls 301-304 and have a thickness $T_1$ (shown in FIG. 4). Also shown, the shroud body 300 includes a lip or flange portion 320 that projects away from the outer shroud surface 311 along the shroud walls 301-304. The lip portion 320 may define a portion of the back side 314 and be configured to directly engage the exterior surface 138 (FIG. 2) of the support wall 130. The lip portion 320 may increase a surface area of the shroud body 300 that directly engages the exterior surface 138. In some embodiments, the lip portion 320 may operate to distribute mechanical energy experienced by the support wall 130 when the retention shroud 140 experiences rotational or lateral forces in a non-mating direction from the cable assembly 114 (FIG. 1). The lip portion 320 may also increase the surface area of the shroud body 300 that directly contacts the support wall 130.

The shroud body 300 also includes fastener holes 331, 332 and fastener holes 333, 334 (shown in FIG. 5). The fastener holes 331-334 extend through portions of the shroud body 300. For example, the shroud body 300 may include wall projections 341, 342, 343, and 344 that project away from the shroud body 300. More specifically, the wall projections 341, 343 project from the shroud wall 301, and the wall projections 342, 344 project from the shroud wall 303. The wall projections 341-344 provide additional material of the shroud body 300 in which the corresponding fastener holes are defined. As shown, the fastener holes 331, 332 extend entirely through the respective wall projections 341, 342, and the fastener holes 333, 334 extend only partially through the wall projections 342, 344. In other embodiments, the fastener holes 333, 334 may extend entirely through the wall projections 343, 344, respectively.

Optionally, the shroud body 300 may include lip recesses 351, 353 (shown in FIG. 5) and lip recesses 352, 354. The lip recesses 351, 353 are located along the section of the lip portion 320 that extends along the shroud wall 301, and the lip recesses 352, 354 are located along the section of the lip portion 320 that extends along the shroud wall 303. The lip recesses 351-354 may be adjacent to the wall projections 341-344, respectively.

As shown in FIG. 5, the retention shroud 140 may also include a gasket member 360 that is coupled to the retention shroud 140. In the illustrated embodiment, the retention shroud 140 includes a channel or groove 362 that extends into the shroud body 300 along the back side 314. The channel 362 may extend entirely along the lip portion 320 and surround the shroud passage 306. In the illustrated embodiment, the gasket member 360 is an elastomeric loop or band that is deposited within the channel 362.

Figure 6:
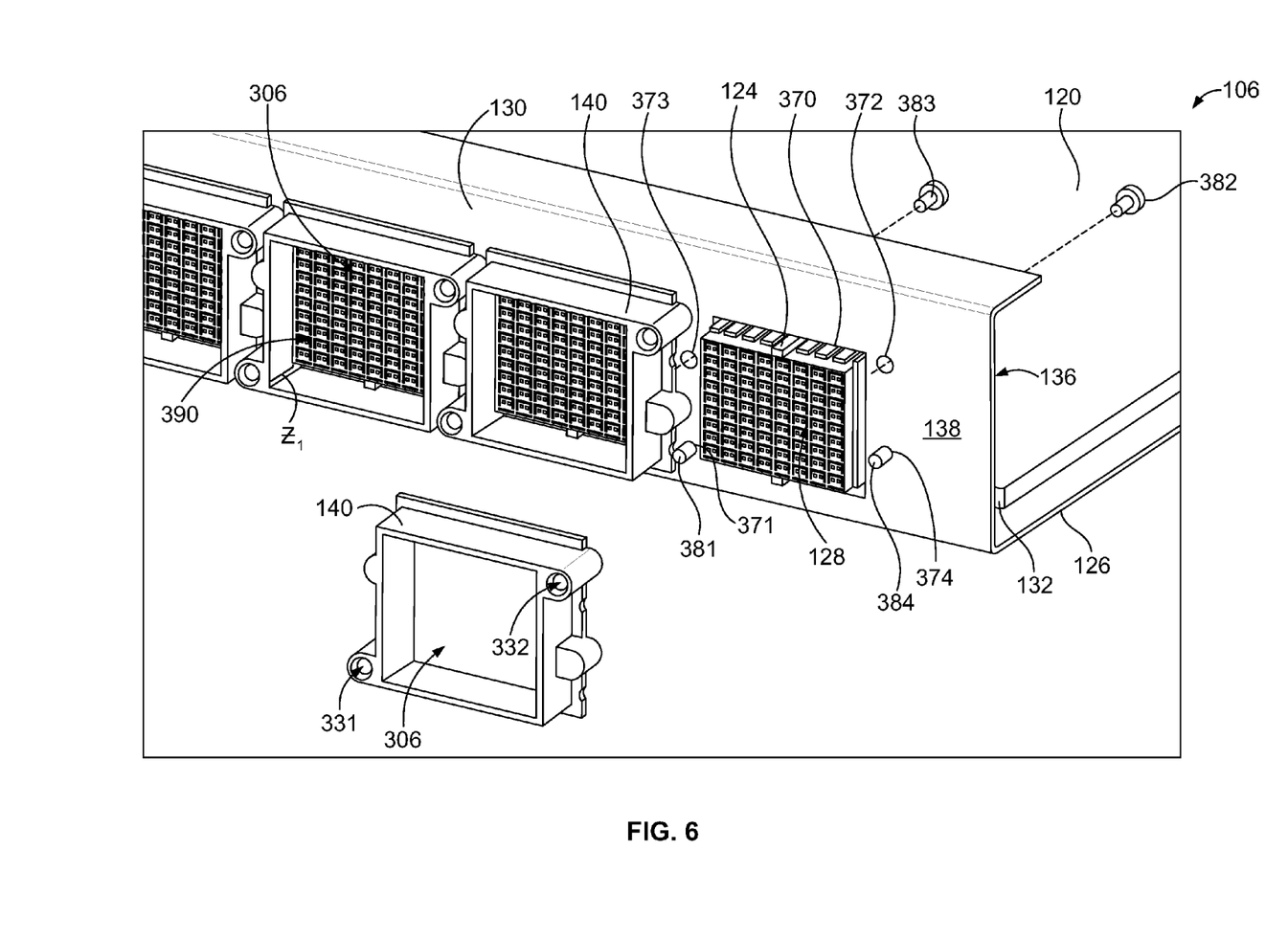
FIG. 6 is an enlarged view of the daughter card assembly illustrating one of the retention shrouds prior to mounting.

FIG. 6 is an enlarged view of the daughter card assembly 106 illustrating one of the retention shrouds 140 prior to mounting the retention shroud 140 to the exterior surface 138 of the support wall 130. The trailing connector 124 is mounted to the circuit board 120 proximate to the trailing edge 132. As shown, support wall 130 is oriented orthogonal to the circuit board 120 and extends along the trailing edge 132. The support wall 130 extends parallel to the trailing edge 132. In the illustrated embodiment, the interior surface 136 of the support wall 130 is spaced apart from the trailing edge 132. The interior surface 136 may be spaced a greater or a lesser distance from the trailing edge in other embodiments. Alternatively, the interior surface 136 of the support wall 130 may be flush with the trailing edge 132. As shown, the support wall 130 has a wall opening 370 that extends through the interior and exterior surfaces 136, 138.

The trailing connector 124 is positioned on the circuit board 120 such that the mating end 128 of the trailing connector 124 substantially aligns with the wall opening 370. In the illustrated embodiment, the mating end 128 extends through the wall opening 370 and projects beyond the exterior surface 138. The shroud passage 306 is configured to at least one of receive the trailing connector 124 or receive the cable connector 402 (FIG. 1) that mates with the trailing connector 124. Thus, the mating end 128 may be substantially aligned with the wall opening 370 if the mating end 128 is permitted to extend through the wall opening 370 and clear the exterior surface 138 or if the mating end 128 does not clear the support wall 130 but is still capable of mating with the cable connector 402 (FIG. 1) when the cable connector 402 is advanced through the wall opening 370.

Also shown, the support wall 130 includes a plurality of fastener openings 371, 372, 373, and 374 that extend through the support wall 130. The fastener openings 371-374 are configured to align with the fastener holes 331, 332 and fastener holes 333, 334 (FIG. 5) when the retention shroud 140 is mounted to the support wall 130. The fastener openings 371-374 and the fastener holes 331-334 are sized and shaped to receive shroud fasteners 381, 382, 383, and 384, respectively, which are shown as screws in the illustrated embodiment. In other embodiments, however, the shroud fasteners 381-384 may be rivets or plugs. Alternatively, the retention shroud 140 may be secured to the support wall 130 using other mechanisms.

In the illustrated embodiment, when the retention shroud 140 is secured to the support wall 130, the mating end 128 of the trailing connector 124 may be disposed a depth $Z_1$ within a connector cavity 390 that is defined by the retention shroud 140. In the illustrated embodiment, a portion of the shroud passage 306 becomes the connector cavity 390 when the retention shroud 140 is mounted to the support wall 130.

Figure 7:
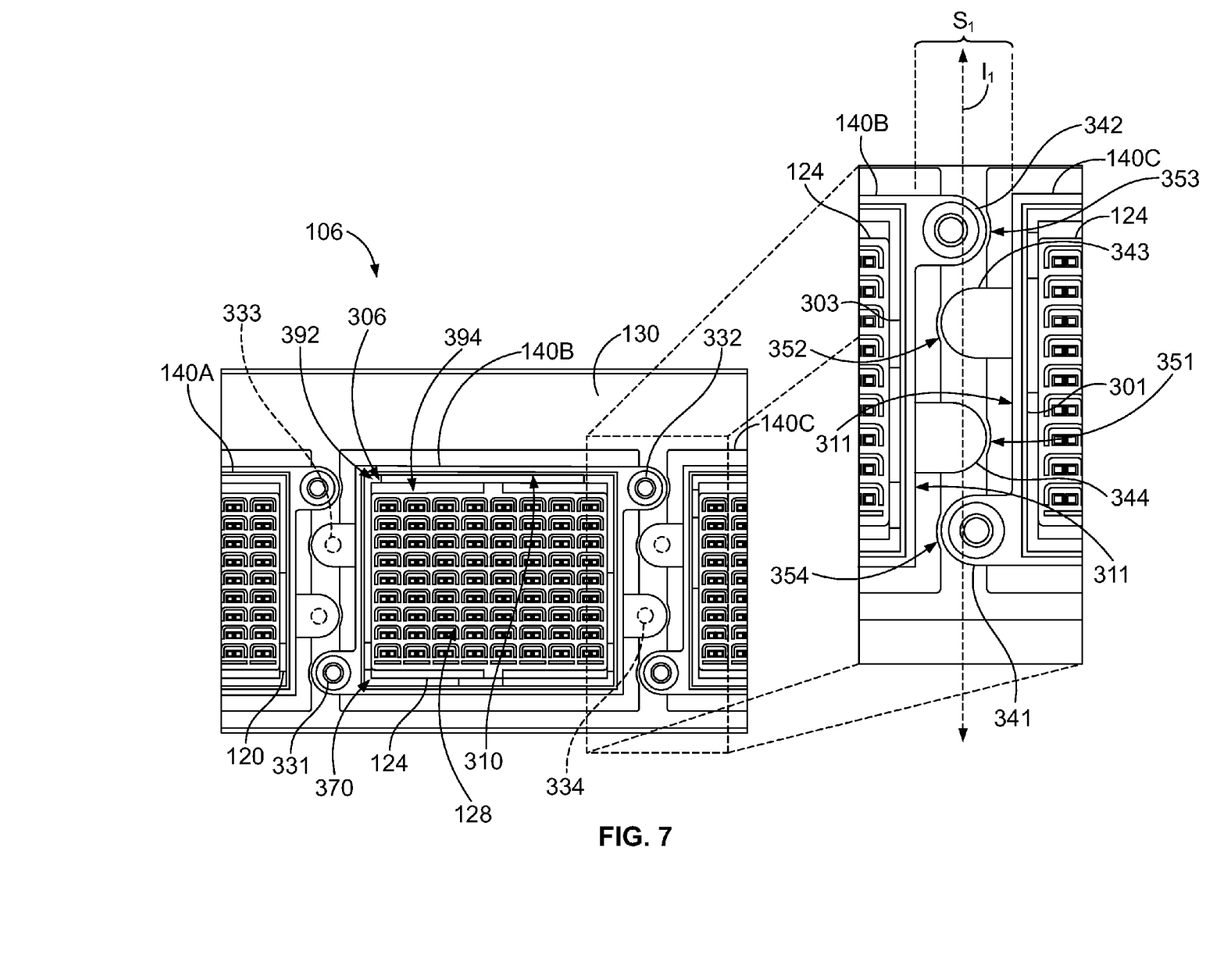
FIG. 7 is a plan view of the daughter card assembly with the retention shroud mounted to a support wall of the daughter card assembly.

FIG. 7 includes an enlarged plan view of the daughter card assembly 106 with a plurality of retention shrouds 140A, 140B, and 140C mounted to the support wall 130. To mount the retention shrouds 140A-140C to the support wall 130, each of the retention shrouds 140A-140C may be positioned along the support wall 130 such that the corresponding shroud passage 306 and the corresponding wall opening 370 are aligned with each other. The shroud fasteners 381-384 (FIG. 6) may then be inserted through the fastener openings 371-374 (FIG. 6) of the support wall 130 and into the fastener holes 331-334 of the corresponding retention shrouds 140A-140C. The shroud fasteners 381-384 may affix the retention shrouds 140A-140C to the support wall 130.

When the retention shrouds 140A-140C are secured to the support wall 130, the back sides 314 (FIG. 4) may be in intimate contact with the support wall 130. For embodiments in which the retention shrouds 140A-140C and the support wall 130 are conductive, the retention shrouds 140A-140C and the support wall 130 may be electrically grounded to transmit EMI away from the communicative connections. In some embodiments, a conductive adhesive or layer (not shown) may be deposited along the back side 314 to facilitate electrically coupling the retention shroud 140 and the support wall 130.

Also shown in FIG. 7, when the daughter card assembly 106 is fully assembled, a gap 392 may exist between the inner shroud surface 310 and an exterior connector surface 394 of the trailing connector 124. The gap 392 may be sized and shaped to receive a portion of the cable connector 402 (FIG. 1). In some embodiments, the trailing connector 124 is separate from the corresponding retention shroud 140 and the support wall 130. For example, the trailing connector 124 may not directly contact the retention shroud 140 or the support wall 130. Instead, the retention shroud 140 may only be indirectly coupled to the trailing connector 124 through the support wall 130 and the circuit board 120.

FIG. 7 also shows an enlarged portion of the daughter card assembly 106 illustrating adjacent retention shrouds 140B, 140C. Specifically, the shroud wall 303 of a first retention shroud 140B is shown and the shroud wall 301 of an adjacent second retention shroud 140C is shown. The outer shroud surfaces 311 along the shroud walls 303, 301 are separated by a shroud spacing $S_1$. In some embodiments, the retention shrouds 140B, 140C are configured to reduce the spacing $S_1$ so that a greater number of trailing connectors 124 may be used while also achieving a designated structural integrity.

For example, a single line or plane $I_1$ that extends parallel to the shroud walls 303, 301 may intersect the wall projections 342, 344 of the first retention shroud 140B and also intersect the wall projections 341, 343 of the second retention shroud 140C. Moreover, each of the wall projections may extend into a lip recess of the adjacent retention shroud. For example, as shown in FIG. 7, the wall projections 342, 344 of the retention shroud 140B extend into the lip recesses 353, 351, respectively, of the retention shroud 140C, and the wall projections 343, 341 of the retention shroud 140C extend into the lip recesses 352, 354, respectively, of the retention shroud 140B.

Figure 8:
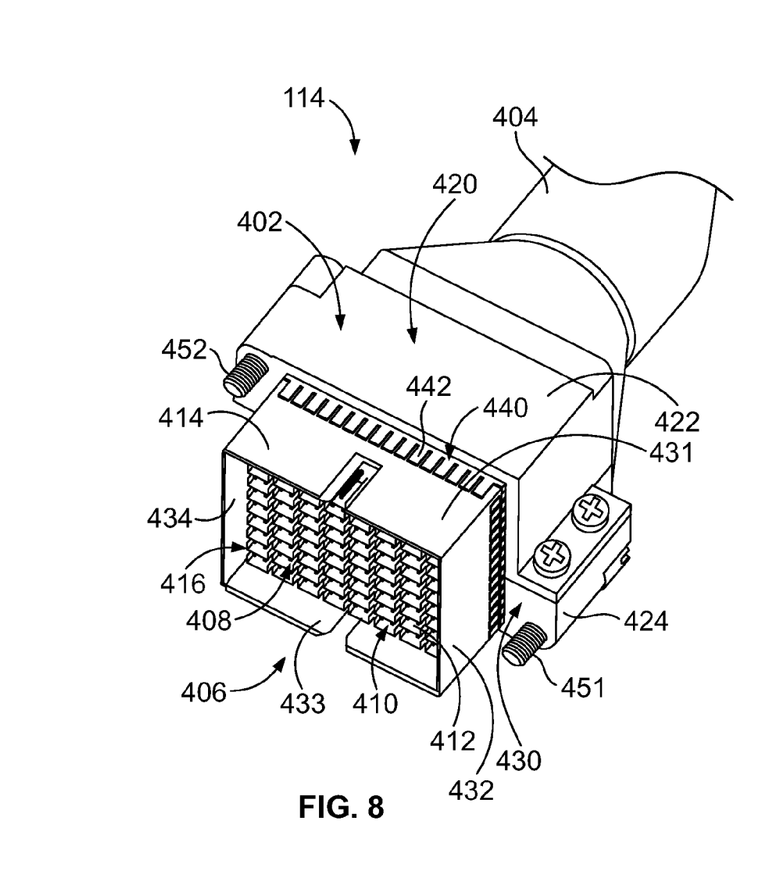
FIG. 8 is a perspective view of a portion of a cable assembly formed in accordance with one embodiment.
Figure 9:
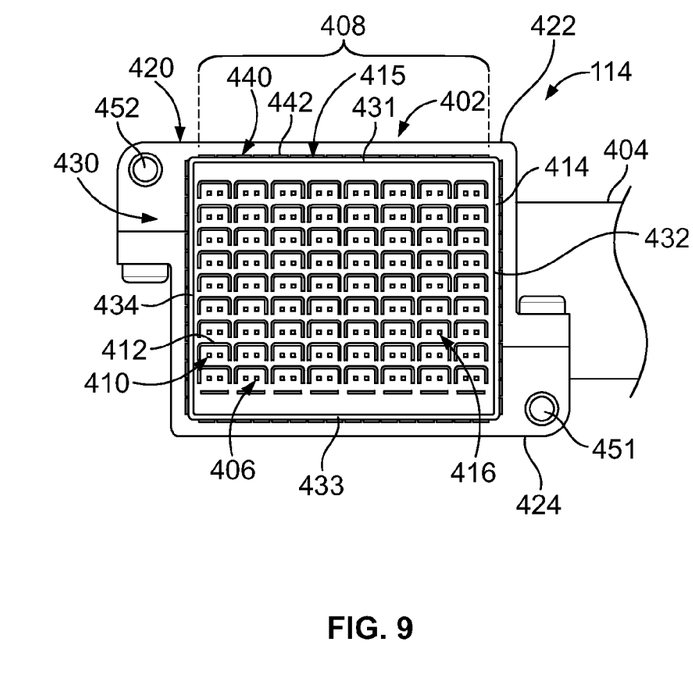
FIG. 9 is an end view of a cable connector of the cable assembly shown in FIG. 8.

FIG. 8 is a perspective view of a portion of the cable assembly 114 having the cable connector 402, and FIG. 9 is an end view of the cable assembly 114. The cable assembly 114 includes the cable connector 402, the cable connector 403 (FIG. 1), and the communication cable 404 that interconnects the cable connectors 402, 403. In other embodiments, the cable connector 402 may be interconnected to more than one cable connector through the communication cable 404.

The cable connector 402 includes a mating end 406 that is configured to engage the mating end 128 (FIG. 2) of the trailing connector 124 (FIG. 2). The mating end 406 may include cable or signal contacts 410 and ground contacts or shields 412 that form a mating array 408. The cable contacts 410 and ground contacts 412 are configured to be received by corresponding contact openings (not shown), such as the contact openings 206, 208 shown in FIG. 3. The cable connector 402 also includes a front housing or shroud 414 having a contact cavity 416 with the mating array 408 disposed therein. The contact cavity 416 is sized and shaped to receive the mating end 128 of the trailing connector 124.

The communication cable 404 may include a plurality of individual wires or conductors (not shown) that are terminated to corresponding cable and ground contacts 410, 412. The cable connector 402 may include a terminating body 420 that is configured to surround the terminations made to the signal and ground contacts 410, 412. In the illustrated embodiment, the terminating body 420 may include body shells 422, 424 that are secured to each other. The body shells 422, 424 may be die cast or molded and may comprise a conductive material. For example, the body shells 422, 424 may be metal or may include a metallized plastic material. The body shells 422, 424 may be secured together with the cable contacts 410, the ground contacts 412, and corresponding terminating ends of the wires (not shown) between the body shells 422, 424. As such, the body shells 422, 424 may form a shield around the data-transmitting elements of the cable connector 402. When coupled, the body shells 422, 424 form a forward-facing surface 430 of the cable connector 402. The forward-facing surface 430 may be substantially flat or planar.

As shown, the front housing 414 projects from the forward-facing surface 430. The front housing 414 may include a plurality of housing walls 431, 432, 433, and 434. Each of the housing walls 431-434 may have thickness that is configured such that the front housing 414 may be inserted into the gap 392 (FIG. 7) that exists between the trailing connector 124 and the inner shroud surface 310 (FIG. 4).

The cable assembly 114 may also include an interposing element 440 that is configured to establish an electrical path between a surface of the cable connector 402 and a surface of the retention shroud 140 (FIG. 2). In the illustrated embodiment, the interposing element 440 is a stamped-and-formed sheet of conductive material that extends circumferentially around the front housing 414. The interposing element 440 may directly engage an outer surface 415 of the front housing 414. The interposing element 440 may include spring fingers 442 that at least partially extend away from the outer surface 415. The spring fingers 442 are configured to engage the inner shroud surface 310 and be deflected toward the outer surface 415. In alternative embodiments, the interposing element 440 may be a conductive adhesive or layer that is located along the forward-facing surface 430. The conductive adhesive may directly connect the forward-facing surface 430 and the mating edge 316 (FIG. 4) of the retention shroud 140 (FIG. 4).

The cable connector 402 also includes cable fasteners 451, 452. When the cable connector 402 is mated to the trailing connector 124 (FIG. 2), the cable fasteners 451, 452 may extend into the fastener holes 331, 332 (FIG. 4), respectively. The fastener holes 331, 332 may be defined by threads that directly engage the cable fasteners 451, 452. Accordingly, the cable connector 402 may be secured to the retention shroud 140 that, in turn, is secured to the support wall 130 (FIG. 2). An electrically grounded pathway may extend through the terminating body 420, the retention shroud 140, and the support wall 130.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A daughter card assembly comprising:
a circuit board having body edges that coincide with a board plane, the body edges including a leading edge and a trailing edge;
leading and trailing connectors mounted to the circuit board and communicatively coupled to each other through the circuit board, the leading and trailing connectors being proximate to the leading and trailing edges, respectively, and having mating ends that face in different directions along the board plane;
a support wall coupled to the circuit board and extending along the trailing edge orthogonal to the board plane, the support wall having opposite interior and exterior surfaces and a wall opening therethrough, the trailing connector being positioned on the circuit board such that the mating end of the trailing connector substantially aligns with the wall opening; and
a retention shroud coupled to the support wall and projecting from the exterior surface, the retention shroud defining a shroud passage that aligns with the wall opening of the support wall, wherein the shroud passage at least one of receives the trailing connector or is configured to receive a cable connector that mates with the trailing connector, wherein the retention shroud is indirectly coupled to the trailing connector through the support wall and the circuit board.

2. The daughter card assembly of claim 1, wherein the retention shroud has an inner shroud surface that defines at least a portion of the shroud passage, the trailing connector having a connector housing that includes at least a portion of the mating end of the trailing connector, the inner shroud surface and the connector housing of the trailing connector having a gap therebetween that is configured to receive a portion of the cable connector, wherein the retention shroud and the support wall are configured to resist forces exerted on the cable connector in a non-mating direction.

3. The daughter card assembly of claim 1, wherein the retention shroud has a back side that engages the exterior surface of the support wall, wherein a gasket member is positioned between the back side and the support wall.

4. The daughter card assembly of claim 1, wherein the retention shroud extends from the support wall and clears the mating end of the trailing connector such that the mating end is located a depth within the shroud passage.

5. The daughter card assembly of claim 1, wherein the retention shroud includes a fastener hole that opens to an exterior of the daughter card assembly and is configured to receive a cable fastener to couple the cable connector thereto.

6. The daughter card assembly of claim 1, wherein the circuit board has opposite board sides, the daughter card assembly further comprising a loading frame that is coupled to the circuit board, the loading frame including the support wall and a board wall that extends along one of the board sides, wherein the loading frame includes a continuous sheet of rigid material, the support and board walls being portions of the sheet.

7. The daughter card assembly of claim 1, wherein the trailing connector includes a mating array of signal and ground contacts at the mating end, the signal contacts being configured for differential transmission of data signals, the mating array being a two-dimensional array and having at least 12 signal contacts per 100 mm$^2$.

8. The daughter card assembly of claim 1, wherein the retention shroud and the support wall are electrically conductive and electrically coupled to each other, the retention shroud configured to electrically ground the cable connector to the support wall.

9. The daughter card assembly of claim 1, wherein the retention shroud includes an inner shroud surface that defines at least a portion of the shroud passage and an outer shroud surface that forms an exterior of the retention shroud, the retention shroud including a lip portion that projects away from the outer shroud surface along the support wall, the lip portion engaging the support wall.

10. The daughter card assembly of claim 1, wherein the leading and trailing connectors have respective two-dimensional mating arrays of signal and ground contacts, the signal contacts being configured for differential transmission of data signals, wherein the mating arrays have at least 20 signal contacts per 100 mm$^2$ and the leading and trailing connectors are capable of transmitting data signals at a data rate of at least 20 gigabits per second.

11. The daughter card assembly of claim 1, wherein the trailing connector has a connector housing that includes the mating end of the trailing connector, the connector housing extending through the wall opening and being positioned within the shroud passage, the shroud passage being defined by an inner shroud surface of the retention shroud, the inner shroud surface facing the connector housing within the shroud passage.

12. A daughter card assembly comprising:
a circuit board having body edges that coincide with a board plane;
a data connector mounted to the circuit board and having a mating end configured to mate with a cable connector, the data connector including a mating array of signal and ground contacts at the mating end configured for differential transmission of data signals, the mating end facing in a direction parallel to the board plane;
a support wall coupled to the circuit board and extending orthogonal to the circuit board and along one of the body edges, the support wall having opposite interior and exterior surfaces and a wall opening therethrough, wherein the data connector is positioned on the circuit board such that the mating end of the data connector substantially aligns with the wall opening; and
a retention shroud coupled to the support wall and projecting from the exterior surface, the retention shroud defining a shroud passage that aligns with the wall opening of the support wall, wherein the shroud passage at least one of receives the data connector or is configured to receive the cable connector that mates with the data connector, the retention shroud being separate from the data connector and indirectly coupled to the data connector through the support wall and the circuit board.

13. The daughter card assembly of claim 12, wherein the retention shroud extends from the support wall and clears the mating end of the data connector such that the mating end is located a depth within the shroud passage.

14. The daughter card assembly of claim 12, wherein the retention shroud has an inner shroud surface that defines at least a portion of the shroud passage, the inner shroud surface and the data connector having a gap therebetween that is configured to receive a portion of the cable connector.

15. The daughter card assembly of claim 12, wherein the retention shroud and the support wall are configured to resist forces exerted on the cable connector in a non-mating direction.

16. A backplane or midplane communication system comprising:
at least one circuit board having an array of electrical connectors mounted thereto;
first and second daughter card assemblies engaged to corresponding electrical connectors of the array along the at least one circuit board, each of the first and second daughter card assemblies comprising:
a daughter card having a leading edge and a trailing edge, the leading edge interfacing with the at least one circuit board; and
a trailing connector mounted to the daughter card proximate to the trailing edge and having a mating end, the trailing connector including a mating array of signal and ground contacts at the mating end configured for differential transmission; and
a cable assembly including first and second cable connectors and a communication cable that interconnects the first and second cable connectors, the first and second cable connectors configured to mate with the trailing connectors of the first and second daughter card assemblies, respectively;
wherein at least one of the first and second daughter card assemblies includes a support wall that is coupled to the corresponding daughter card and extends orthogonal to the corresponding daughter card along the trailing edge, the support wall having a wall opening therethrough, wherein the trailing connector is positioned on the corresponding daughter card such that the mating end of the trailing connector aligns with the wall opening; and
wherein the at least one of the first and second daughter card assemblies includes a retention shroud projecting from the corresponding support wall, the retention shroud defining a shroud passage that aligns with the wall opening of the corresponding support wall, wherein the retention shroud is indirectly coupled to the corresponding trailing connector through the corresponding support wall and the corresponding daughter card.

17. The backplane or midplane communication system of claim 16, wherein the retention shroud has an inner shroud surface that defines at least a portion of the shroud passage, the trailing connector having a connector housing that includes at least a portion of the mating end of the trailing connector, the inner shroud surface and the connector housing of the trailing connector having a gap therebetween that is configured to receive a portion of the cable connector.

* * * * *